United States Patent [19]

Gord

[11] Patent Number: 4,931,795

[45] Date of Patent: Jun. 5, 1990

[54] DIGITAL TO ANALOG SIGNAL CONVERTER

[75] Inventor: John C. Gord, Los Angeles, Calif.

[73] Assignee: Alfred E. Mann Foundation, Sylmar, Calif.

[21] Appl. No.: 391,437

[22] Filed: Aug. 9, 1989

[51] Int. Cl.$^5$ ............................................. H03M 1/66
[52] U.S. Cl. .................................... 341/135; 341/144
[58] Field of Search ................................. 341/135, 144

[56] References Cited

U.S. PATENT DOCUMENTS 4,064,506 12/1977 Cartwright, Jr. .................... 341/135

Primary Examiner—William M. Shoop, Jr.
Assistant Examiner—Sharon D. Logan
Attorney, Agent, or Firm—Robert R. Meads

[57] ABSTRACT

A D to A converter comprising a series of stages each including a current mirror having an input and an output transistor (Q1 and Q3) and a current adjusting transistor (Q2, Q4) connected in parallel with each input and output transistor for adjusting the output current from the current mirror as a function of the operating states of the current adjusting transistors. The operating state of each current adjusting transistor is controlled by a digital signal applied to a switch (Q2S, Q2S') connected to the gate of each current adjusting transistor. Each stage also includes a control circuit (Q1C, Q3C) for maintaining equal the drain voltages of its input and output transistors whereby the current changes introduced in the output current of the converter stage are functions of the relative geometric sizes of the input, output and current adjusting transistors comprising the converter stage.

11 Claims, 1 Drawing Sheet

DIGITAL TO ANALOG SIGNAL CONVERTER

BACKGROUND

The present invention relates to improvements in digital to analog (D to A) signal converters and more particularly to an exponential D to A converter particularly useful in a system including an implanted cochlear electrode for stimulating the cochlea of a hearing impaired person.

The purpose of an exponential D to A signal converter is to convert a digital input signal consisting of a series of digital pulses to an analog output signal the amplitude of which increases in steps where each step is a percentage of the prior step. Various circuits haVe been developed to accomplish that purpose. For a system of the above-described type it has been proposed that the percentage be about 3½ percent. To accomplish this, a converter as illustrated in FIG. 1 has been proposed including a series of stages each comprising a current mirror. In FIG. 1, the current mirror of Stage 1 comprises P-type CMOS input and output transistors Q1 and Q3 while the current mirror of Stage 2 comprises N-type CMOS input and output transistors Q5 and Q7. The gate and drain of the input transistor Q1 are connected to a reference current source while the sources of transistors Q1 and Q3 are connected to a relatively positive supply voltage. The gate and drain of the input transistor Q5 are connected to the output of Stage 1 while the sources of the transistors Q5 and Q7 are connected to a relatively negative supply voltage. A series circuit comprising a current adjusting transistor and a transistor switch is connected in parallel with each input and output transistor. In Stage 1, the P-type CMOS transistors Q2 and Q4 comprise the current adjusting transistors while the P-type CMOS transistors Q2S and Q4S comprise the switching transistors. In Stage 2, the N-type CMOS transistors Q6 and Q8 comprise the current adjusting transistors while the N-type CMOS transistors Q6S and Q8S comprise the switching transistors. The purpose of the series circuits is to slightly increase or decrease the output current of the current mirror to which they are connected. For example, activation of Q2 by a turning on of Q2S decreases slightly the current output of Stage 1, preferably by about 3½ percent. When Q4 is activated by a turning on of Q4S, the current output of Stage 1 is increased, preferably by about 7 percent. As illustrated, the transistor switches are under the control of digital pulses applied to input terminals connected to the gates of the transistors Q2S, Q4S, Q6S and Q6S. Thus for Stage 1, by application of digital pulses to the input terminals of the transistors Q2S and Q4S, the output current of Stage 1 may be stepped by increments of about $-3\frac{1}{2}$, 0, $+3\frac{1}{2}$ and 7 percent. In a similar manner, the output current of Stage 2 may be stepped by increments of about 15 and 30 percent.

In practice it has been found that the converter of FIG. 1 presents certain undesirable problems. First, the switching transistors possess some resistance and being in series with the sources of the current adjusting transistors, the source to drain currents of the current adjusting transistors flow therethrough. Thus, the switching transistors introduce voltage drops that are reflected as changes in the gate voltages of the adjacent current adjusting transistors and undesired changes in the output currents of the current mirrors. Second, in the circuit of FIG. it is very difficult to predictably control the output currents. This is because the input and output transistors comprising the current mirrors do not operate under the same conditions. In particular, the drain voltages of the input and output transistors are not maintained constant. For example, the drain voltage of the input transistor Q5 is substantially different than the drain voltage of the output transistor Q7. For the transistors to be matched in operation requires that they operate at substantially the same drain voltages.

The D to A converter of the present invention overcomes the foregoing problems of the circuit of FIG. 1 and represents a substantial improvement in D to A converters particularly those useful in implantable systems for stimulating the cochlea of the hearing impaired.

SUMMARY OF THE INVENTION

The present invention comprises a D to A converter including a series of stages each comprising a current mirror having an input and an output transistor connected to a supply voltage. The input transistor of a first stage of the converter is connected to a reference current source and the output transistor of each stage is connected to an output for the current mirror comprising that stage. A current adjusting transistor is connected in parallel with each input and output transistor for adjusting in predetermined increments the output current of each current mirror as a function of the operating state of the current adjusting transistors. A digital signal activated switch means is connected to a gate of each current adjusting transistor to selectively control the operating state of each such transistor without introducing undesired voltage drops or changes in the currents flowing through the current adjusting transistors when activated. Circuit means are connected to the input and output transistors of each stage of the converter and regulate and hold equal the drain voltages on such input and output transistors whereby the values of the output currents from each stage of the converter are direct functions of the relative geometric sizes of the stage's input and output transistors. Such sizes can be carefully controlled during manufacture and assembly of the converter to produce a converter having highly predictable and controllable output currents.

DETAILED DESCRIPTION OF INVENTION

Figure 2:
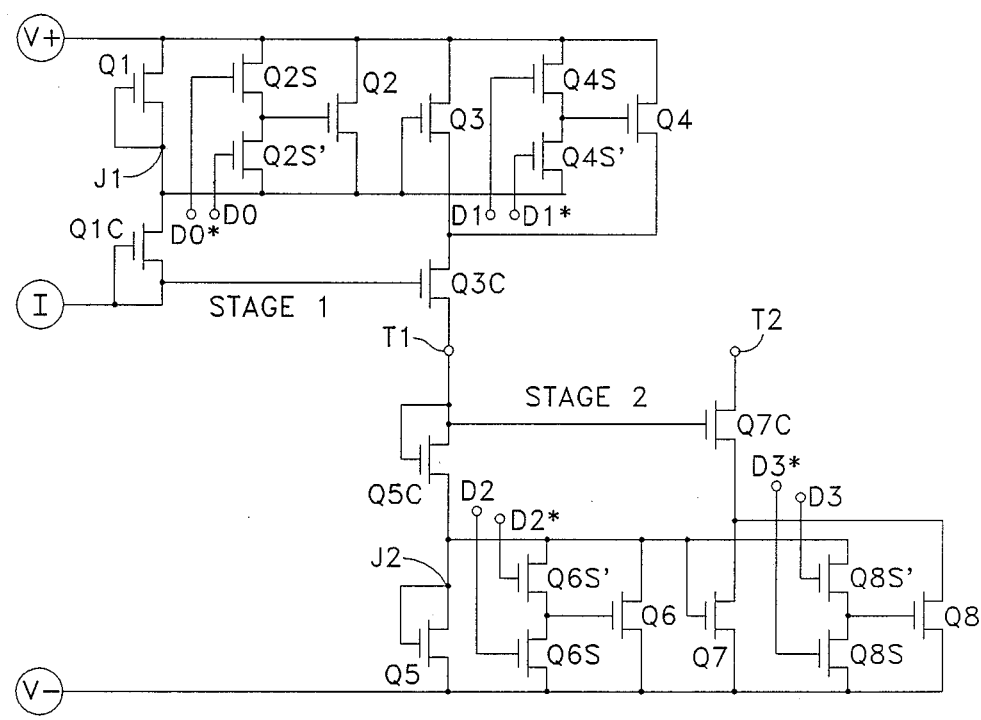
FIG. 2 is a circuit diagram of the first two stages of a D to A converter in accordance with the present invention.

The embodiment of the present invention shown in FIG. 2 comprises only two stages with stage 1 including P-type CMOS transistors and stage 2 including N-type CMOS transistors. Such types of transistors are exemplary only The D to A converter of the present invention may comprise different types of transistors and may include many more stages than two.

As represented in FIG. 2, the converter of the present invention has a plurality or series of stages each comprising a current mirror having an input and an output transistor and a current adjusting transistor connected in parallel with each of the input and output transistors for activation by a switch connected to the gate thereof. The value of the output current from each stage of the converter is a direct function of the operating state of its current adjusting transistors and the operating states of the current adjusting transistors are controlled by digital input pulses applied to the switches connected to the gates of the current adjusting transistors. As will be described in detail hereinafter, in providing such control, the switches do not introduce undesired voltage drops or current changes. Further, control circuits are included for maintaining equal the drain voltages of the input and output transistors of each stage of the converter whereby the value of the converter output current may be precisely and predictably controlled with changes in the operating states of the current adjusting transistors to values determined by the relative geometric sizes of the input, output and current adjusting transistors. Such geometric sizes may be precisely controlled during the manufacture and assembly of the converter.

In the illustrated preferred form of the invention, the current mirror of each stage is similar to a cascade current source such as illustrated and described in *Analog MOS Integrated Circuits For Signal Processing*, by Roubik Gregorian and Gabor C. Temes, published 1986 by John Wiley & Sons, Inc., pages 131-132. More particularly, for stage 1 of the converter, the current mirror or cascode-type current source comprises a F-type CMOS input transistor Q1 and a P-type CMOS output transistor Q3. The sources of Q1 and Q3 are connected to a supply voltage V+ while the gate and drain of Q1 are connected at a junction J1. J1, in turn, is connected to the gate of Q3 and as an input terminal for Q1 is connected to a reference current source I. The drain of Q3 is connected to an output terminal T1 pior stage 1 of the converter.

In addition to the input and output transistors Q1 and Q3, the cascode source comprising stage 1 of the converter includes P-type CMOS control transistors Q1C and Q3C. The source of Q1C is connected to the junotion J1 while the gate and drain of Q1C are connected together and to the current source 1 and the gate of Q3C. The source of Q3C is connected to the drain of Q3 while the drain of Q3C is connected to the output terminal T1. Q1C functions as a diode connected at J1 of Q1 and establishes a gate voltage for Q3C. By operation of the control transistors, the drain voltage on Q3 is held very close to the value of the drain voltage on Q1 independent of current changes and Q1 and Q3 see the same drain voltage.

In stage 1 of the converter shown in FIG. 2, the current adjusting transistors are P-type CMOS transistors Q2 and Q4. Q2 is connected in parallel with input transistor Q1, the source and drain of Q2 being connected to the source and drain respectively of Q1. Q4 is connected in parallel with output transistor Q3, the source and drain of Q4 being connected to the source and drain respectively of Q3. The switches connected to the gates of the current adjusting transistors Q2 and Q4 each comprise a series circuit of two P-type CMOS transistors. For Q2, the switch comprises a switching transistor Q2S connected between the gate and source of Q2 and a switching transistor Q2S' connected between the gate and drain of Q2. The gates of Q2S' and Q2S are connected to receive digital pulses D0 and D0* respectively of a 4 bit parallel word input to the converter, D0 and D0* comprising one bit of the word input and D0* being the complement of D0. For Q4, the switch comprises a switching transistor Q4S connected between the gate and source of Q4 and a switching transistor Q4S' connected between the gate and drain of Q4. The gates of Q4S and Q4S' are connected to receive digital pulses D1 and D1* respectively of the 4 bit parallel word input to the converter, D1 and D1* comprising one bit of the word input and D1* being the complement of D1.

Figure 1:
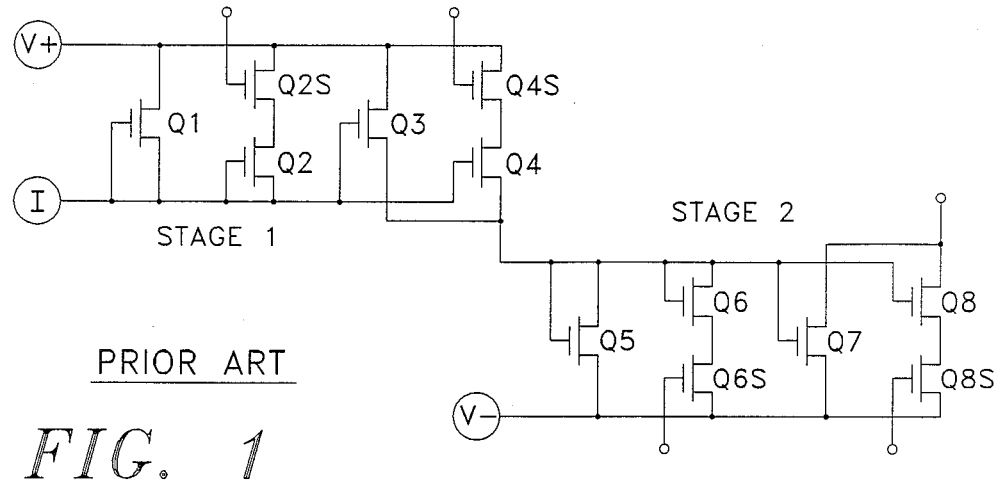
FIG. 1 is a circuit diagram of the first two stages of a previously proposed D to A converter.

Under the control of the digital word input, the switching transistors Q2S, Q2S', Q4S and Q4S' are selectively activated to switch the current adjusting transistors Q2 and Q4 in and out in parallel with the input and output transistors Q1 and Q3 respectively. As the transistors Q2 and Q4 are switched in and out of stage 1, the stage 1 output current Io$_1$ is stepped between different amplitude values which, as will be described hereinafter, are each a precisely controlled percentage of the input current from the current source I. In providing such controlled operation of stage 1 of the converter, the switches do not introduce undesired voltage drops or current changes since they are connected in the gate circuits of the current adjusting transistors. This represents a substantial operational improvement over the prior art converter of FIG. 1.

Considering now the amplitude values to which the stage output current Io$_1$ is stepped with selective operation of the current adjusting transistors Q4 and Q6, it is a feature of the present invention that such percentage values of the input current may be carefully predetermined by controlling the geometric sizes of the input, output and current adjusting transistors of stage 1. More particularly, in the manufacture of the converter, all transistors comprising stage 1 are located in close proximity on the same chip. As previously described, the control transistors Q1C and Q3C maintain equal drain voltages on the input and output transistors Q1 and Q3. Under such controlled conditions, it has been found that the ratio of the source to drain currents flowing in Q1 and Q3 is a direct function of the relative geometric sizes of Q1 and Q3. Since switching the current adjusting transistors Q2 and Q4 in and out in parallel with Q1 and Q3 in effect changes the size of Q1 and Q3 respectively, and the input current from the current source I is maintained constant, the output current of stage 1 of the converter Io$_1$ is a direct function of the sizes of Q1, Q2, Q3 and Q4. For example, it has been found that when the widths and lengths of such transistors are as follows:

Q1, 12 microns by 12 microns
Q2, 5 microns by 115 microns
Q3, 67 microns by 12 microns
Q4, 5 microns by 13 microns and when only Q1 and Q3 are on, Io$_1$: is substantially equal to the input current. When Q1, Q2 and Q3 are on, Io$_1$ is about 3½% less than the input current. When Q1, Q2, Q3 and Q4 are on, Io$_1$ is about 3½% greater than the input current. When Q1, Q3 and Q4 are on, Io$_1$ is about 7% greater than the input current. In this manner, stage 1 of the converter of the present invention comprises a first stage of an exponential D to A converter wherein the output current is precisely and predictably controlled by closely controlling the relative sizes of the input, output and current adjusting transistors in the manufacture of the chip comprising stage 1 of the converter.

Similarly, for stage 2 of the converter of the present invention, the output current Io$_2$ is precisely and predictably controlled by carefully defined percentages of the input current thereto, namely Io$_1$, based upon the relative sizes of the input, output and current adjusting transistors comprising components of stage 2.

In contrast to stage 1 of the illustrated form of the converter of the present invention, in stage 2 all transistors are N-type CMOS transistors. However, as in stage 1, stage 2 comprises a current mirror or preferably a cascode current source including input, output and control transistors, and current adjusting transistors activated by switches connected to the gates thereof.

More particularly, in stage 2, the source of an input transistor Q5 is connected to a relatively negative supply voltage V— while the gate and drain of Q5 are connected at a junction J2. The junction J2 is connected to the gate of an output transistor Q7 and to the source of a control transistor Q5C having its gate and drain connected to the output terminal T1 of stage 1 to receive the stage 1 output current $Io_1$. The source of the output transistor Q7 is also connected to the supply voltage V— while its drain is connected to the source of a control transistor Q7C. Q7C has its gate connected to the drain of Q5C and its drain connected to an output terminal T2 for stage 2 of the converter. The control transistors Q5C and Q7C perform the same function for the input and output transistors Q5 and Q7 as do the control transistors Q1C and Q3C for the input and output transistors Q1 and Q3 of stage i of the converter. Hence, the drain voltages of the input and output transistors Q5 and Q7 are maintained substantially equal.

In stage 2, current adjusting transistors Q6 and Q8 are connected in parallel with the input and output transistors Q5 and Q7 respectively, the source and drain of Q6 being connected to the source and drain respectively of Q5 and the source and drain of Q8 being connected to the source and drain respectively of Q7. As in stage 1, the switches controlling operation of the current adjusting transistors each comprise a series circuit. For Q6, the switch comprises a switching transistor Q6S connected between the source and gate of Q6 and a switching transistor Q6S' connected between the gate and drain of Q6. The gates of Q6S and Q6S' are connected to receive a digital pulses D2 and D2* respectively of the 4 bit parallel word input to the converter, D2 and D2 comprising one bit of the digital word input and D2* being the complememt of D2. For Q8, the switch comprises a switching transistor Q8S connected between the source and gate of Q8 and switching transistor Q8S' connected between the gate and drain of Q8. The gates of Q8S and Q8S' are connected to receive digital pulses D3* and D3 of the digital word input, D3 and D3* comprising one bit of the digital word input and D3* being the complement of D3.

Being connected in the gate circuit of the current adjusting transistors Q6 and Q8, the switch controlling operation of Q6 and Q8 do not introduce undesired voltage drops or current changes with switching operation. As previously stated, this represents a substantial operating improvement over the converter shown in FIG. 1. wherein the operation of the switch circuits introduced undesired voltage drops and current changes in the current mirrors comprising the stages of the converter.

By virtue of the drain voltage regulation provided by the control transistors for the input and output transistors of stage 2, placement of the components of stage 2 in close proximity on the same chip results in a converter stage wherein the ratio of the currents flowing in the input and output transistors is a direct and controllable function of the geometric sizes of the input and output transistors. As in stage 1, selective activation of the switches in response to the digital word input switches the current adjusting transistors of stage 2 in and out in parallel with the input and output transistors to increase and decrease the effective sizes of the input and output transistors. Such effective size changes are reflected in changes in the ratios of the input and output currents. For example, it has been found that when the widths and lengths of the transistors Q5, Q6, Q7 and Q8 are as follows:

Q5, 35 microns by 25 microns
Q6, 5 microns by 25 microns
Q7, 24 microns by 24 microns
Q8, 7.5 microns by 24 microns the output current $Io_2$ changes by steps of about 15 and 30% of $Io_1$ with changes in the operating states of the current adjusting transistors Q6 and Q8. Specifically, when only Q5 and Q7 are on, $Io_2$ is equal to $(k)Io_1$:, where k is a predetermined constant. When Q5, Q6 and Q7 are on, $Io_2$ is equal to $0.85(k)Io_1$:. When Q5, Q6, Q7 and Q8 are on, $Io_1$: is equal to $1.15(k)Io_1$:. When Q5, Q7 and Q8 are on, $Io_2$ is equal to $1.3(k)Io'$. Thus, in the preferred form of the invention, stage 2 also comprises an exponential D to A converter stage wherein the output currents are predictable and controllable by careful control of the geometric sizes of its components during manufacture and assembly of the chip upon which they are mounted.

While a preferred embodiment of a D to A converter has been described in detail hereinabove, it is to be understood that changes and modifications may be made in the illustrated converter without departing from the spirit of the invention. Accordingly, the present invention is to be limited in scope only by following claims.

I claim:

1. A D to A converter stage comprising:
   a current mirror including an input transistor and an output transistor connected to a supply voltage, the input transistor also being connected to a reference current source and the output transistor being connected to an output for the current mirror;
   a current adjusting transistor in parallel with each of the input and output transistors for adjusting the output current of the current mirror as a function of the operating states of the current adjusting transistors;
   digital signal activated switch means for selectively controlling operation of each current adjusting transistor; and
   circuit means for regulating drain voltages on the input and output transistors whereby the values of currents flowing in the input and output transistors and hence the value of the output current is a direct function of the relative geometric sizes of the input, output and current adjusting transistors.

2. The converter stage of claim 1 wherein the switch means comprises a switch connected to a gate of each current adjusting transistor.

3. The converter stage of claim 1 wherein the input transistor includes a drain and a gate connected to a gate of the output transistor and a source connected to a source of the output transistor and to the supply voltage.

4. The converter stage of claim 3 wherein each current adjusting transistor has a source connected to the supply voltage and a drain connected to a drain of the input or output transistor to which it is connected in parallel and wherein the switching means for each current adjusting transistor comprises a series circuit including a first switching transistor connected between the gate and source of the current adjusting transistor and a second switching transistor connected between the gate and drain of the current regulating transistor, each switching transistor being selectively controlled by a digital signal applied thereto.

5. The converter stage of claim 1 wherein the circuit means for regulating the drain voltages in the input and output transistors comprises a first control transistor having a source connected to a drain of the input transistor and a gate and drain connected together and to the reference current source and a second control transistor having a source connected to a drain of the output transistor and a gate connected to the drain of the first control transistor whereby substantially the same gate to source voltages are applied to the first and second control transistors and the input and output transistors see substantially the same drain voltage.

6. A D to A converter comprising:
a series of current mirrors each including an input and an output transistor connected to a supply voltage, a first one of the input transistors being connected to a reference current source, each output transistor being connected to a output for the current mirror in which it is included;
a current adjusting transistor in parallel with each input and output transistor for adjusting the output current of the current mirror in which it is included as a function of its operating state;
digital signal activated switch means for selectively controlling operation of each current adjusting transistor; and
circuit means for regulating drain voltages on each input and output transistor whereby the values of currents flowing in the input and output transistors and hence the value of each current mirror output current is a direct function of the relative sizes of the input, output and current adjusting transistors comprising the current mirror.

7. The converter of claim 6 wherein each input transistor includes a drain and gate connected to a gate of an associated output transistor included in the current mirror including the input transistor and a source connected to a source of the associated output transistor and to the supply voltage.

8. The converter of claim 7 wherein each current adjusting transistor has a source connected to a supply voltage and a drain connected to a drain of the input o output transistor to which it is connected in parallel and wherein the switch means for each current adjusting transistor comprises a series circuit including a first switching transistor connected between the gate and source of the current adjusting transistor and a second switching transistor connected between the gate and drain of the current adjusting transistor, each switching transistor being selectively controlled by a digital signal applied thereto.

9. The converter of claim 8 wherein the circuit means for regulating the drain voltages in the input and output transistors comprises for each current mirror:
a first control transistor having a source connected to a drain of the input transistor included in the current mirror and a gate and drain connected together at a junction, the gate and drain junction for the first control transistor connected to the first one of the input transistors being connected to the reference current source and the gate and drain junctions for all other first control transistors being connected to an output terminal for the immediately prior current mirror to receive the output current thereof, and
a second control transistor having a source connected to the drain of the output transistor included in the current mirror and a gate connected to the drain of the first control transistor for the current mirror whereby substantially the same gate to source voltages are applied to the first and second control transistors and the input and output transistors of each current mirror will see substantially the same drain voltage.

10. A D to A converter stage comprising:
a current mirror including an input transistor and an output transistor connected to a supply voltage, the input transistor also being connected to a reference current source and the output transistor being connected to an output for the current mirror;
a current adjusting transistor in parallel with each of the input and output transistors for adjusting the output current of the current mirror as a function of the operating states of the current adjusting transistors; and
digital signal activated switch means connected to a gate of each current adjusting transistor for selectively controlling operation of each current adjusting transistor.

11. The converter stage of claim 10 wherein each current adjusting transistor has a source connected to the supply voltage and a drain connected to a drain of the input or output transistor to which it is connected in parallel and wherein the switching means for each current adjusting transistor comprises a series circuit including a first switching transistor connected between the gate and source of the current adjusting transistor and a second switching transistor connected between the gate and drain of the current adjusting transistor, each switching transistor being selectively controlled by a digital signal applied thereto.

* * * * *